(12) United States Patent
Casper et al.

(10) Patent No.: US 7,102,560 B2
(45) Date of Patent: Sep. 5, 2006

(54) ANALOG TO DIGITAL CONVERTER HAVING AN INPUT SWITCHING NETWORK RESPONSIVE TO A DIGITAL OUTPUT SIGNAL

(75) Inventors: Bryan K. Casper, Hillsboro, OR (US); Craig S. Petrie, Provo, UT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,477

(22) Filed: Dec. 28, 2004

(65) Prior Publication Data

US 2006/0139199 A1    Jun. 29, 2006

(51) Int. Cl.
*H03M 1/34* (2006.01)

(52) U.S. Cl. .................................. 341/163; 341/161
(58) Field of Classification Search ......... 341/155–165
See application file for complete search history.

(56) References Cited

U.S. PATENT DOCUMENTS 6,097,326 A * 8/2000 Opris et al. ................. 341/161
6,400,220 B1 * 6/2002 Wang et al. ................ 341/155
6,577,185 B1 * 6/2003 Chandler et al. ........... 341/155
6,753,801 B1 * 6/2004 Rossi ......................... 341/161
2003/0058146 A1 * 3/2003 Sundquist et al.

OTHER PUBLICATIONS

Ginetti, Bernard , "A CMOS 13-b Cyclic RSD A/D Converter", *IEEE Journal of Solid-State Circuits*, vol. 27, No. 7, (Jul. 1992),pp. 957-965.
Matsumoto, Hiroki, "Switched-Capacitor Algorithmic Digital-to-Analog Converters", *IEEE Transactions on Circuits ans Systems*, vol. CAS-33, No. 7, (Jul. 1986),pp. 721-724.
Moussavi, Mohsen , "A Differential Bipolar Quasi-Passive Cyclic Digital-to-Analog Converter with 4.416 MSps Conversion Rate and—77dB THD", *IEEE 2001 Custom Integrated Circuits Conference*, (2001),pp. 161-164, no month.

* cited by examiner

*Primary Examiner*—Lam T. Mai
(74) *Attorney, Agent, or Firm*—LeMoine Patent Services, PLLC

(57) ABSTRACT

A cyclic analog to digital converter (ADC) circuit operates to convert an analog input voltage into a digital output word. The ADC circuit includes an amplifier and capacitors configured as an integrator.

14 Claims, 4 Drawing Sheets

ANALOG TO DIGITAL CONVERTER HAVING AN INPUT SWITCHING NETWORK RESPONSIVE TO A DIGITAL OUTPUT SIGNAL

FIELD

The present invention relates generally to electronic circuits, and more specifically to analog to digital converter circuits.

BACKGROUND

Analog to digital converter (ADC) circuits convert analog voltages into digital words.

DESCRIPTION OF EMBODIMENTS

Figure 1:
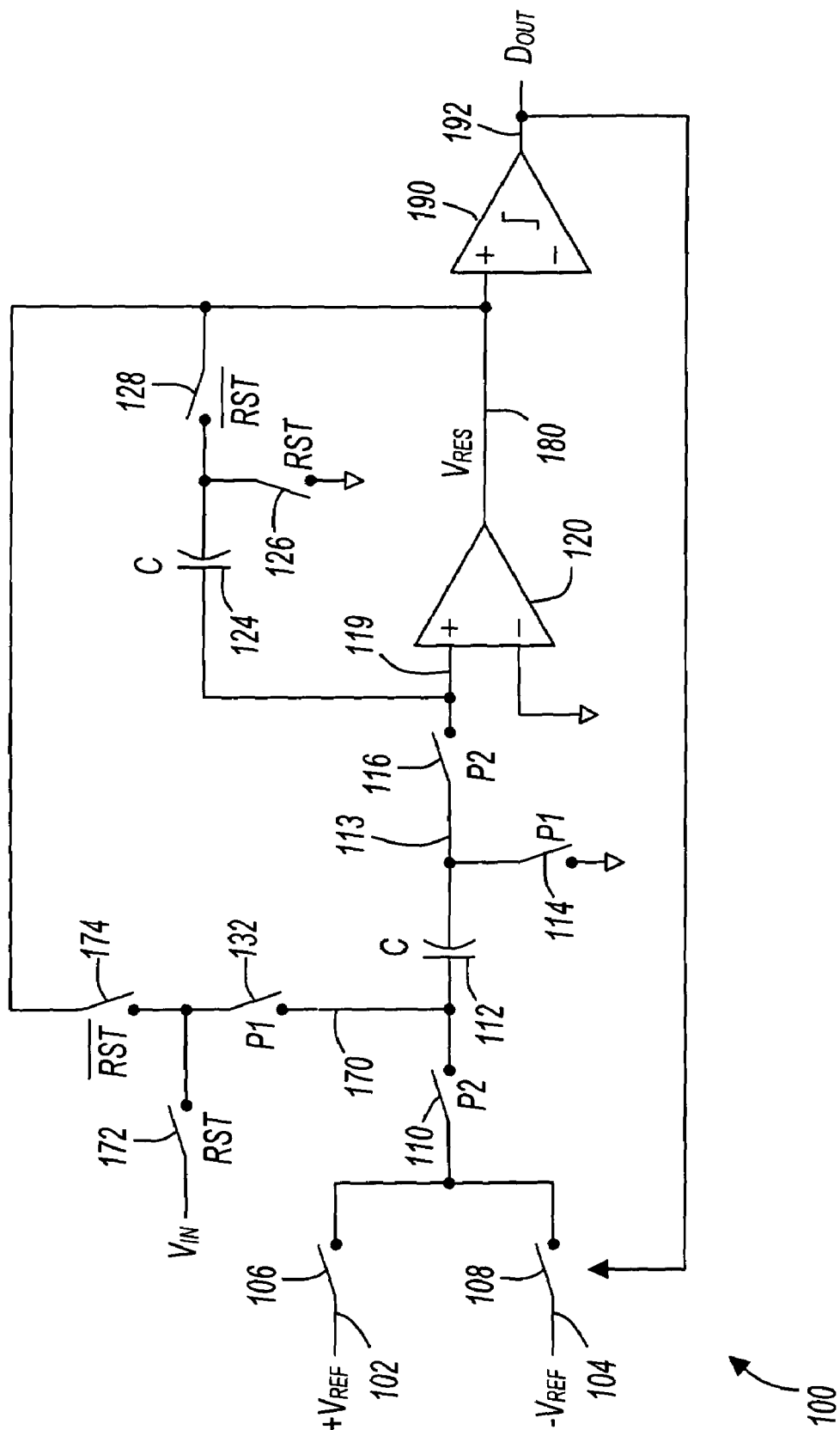
FIG. 1 shows a single-ended analog to digital converter circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows an analog to digital converter (ADC) circuit. ADC circuit 100 includes operational amplifier (opamp) 120, comparator 190, and capacitors 112 and 124. ADC circuit 100 also includes switches 106, 108, 110, 114, 116, 126, 128, 132, 172, and 174. Switches 126, 128, 172, and 174 are controlled by a reset signal shown as RST in FIG. 1. Further, switches 114 and 132 (the "P1 switches") are controlled by a first signal shown as P1, and switches 110 and 116 (the "P2 switches") are controlled by a second signal shown as P2.

The switches shown in FIG. 1 represent switching elements that may be implemented using any suitable circuit element(s). For example, in some embodiments, one or more switches are implemented using isolated gate transistors such as metal oxide semiconductor field effect transistors (MOSFET). Further, in some embodiments, complementary MOSFETs are coupled in parallel to form pass gates. For example, an n-channel MOSFET may be coupled in parallel with a p-channel MOSFET as a pass gate to implement one or more switches in FIG. 1.

ADC 100 receives an analog voltage $V_{IN}$ and produces a digital output word $D_{OUT}$. $D_{OUT}$ may be any number of bits long. $V_{IN}$ may be any voltage value that falls between two reference voltages, shown as $+V_{REF}$ and $-V_{REF}$ in FIG. 1.

In operation, ADC 100 is reset, the input voltage $V_{IN}$ is sampled, and then the P1 and P2 switches are alternately closed to produce a digital output word $D_{OUT}$ on node 192. ADC 100 is reset by asserting the RST signal to close switches 126 and 172, and open switches 128 and 174. In some embodiments, the P1 switches and P2 switches are also closed during a reset of ADC 100. With switches 172 and 132 closed, the input voltage $V_{IN}$ is sampled by capacitor 112. After a reset, RST is de-asserted for the remainder of the conversion of the input voltage $V_{IN}$ to a digital output word $D_{OUT}$. When RST is de-asserted, switch 128 closes and switch 126 opens, to form a feedback circuit that includes capacitor 124 coupled between node 180 and input node 119. Further, with RST de-asserted, switch 172 opens and switch 174 closes to remove the input voltage $V_{IN}$ from the input.

After ADC 100 is reset as described in the above paragraph, the conversion process is started. During the conversion process, output bits are created on $D_{OUT}$ most significant bit (MSB) first, and for each output bit, signals P1 and P2 are alternately asserted. The time period during which P1 is asserted is referred to herein as "phase one" for a particular output bit, and the time period during which P2 is asserted is referred to herein as "phase two" for the output bit.

In some embodiments, phases one and two do not overlap. For example, the switches that are closed during phase one are opened prior to the phase two switches closing during phase two. Likewise, the phase two switches are opened prior to the phase one switches closing. In some embodiments, P1 and P2 are opposite phases of a clock signal.

During phase one, switch 114 is closed to couple node 113 to a reference potential, and switch 132 is closed to provide a feedback path between node 180 and node 170. During phase two, a positive or negative reference voltage ($V_{REF}$) is conditionally applied to the input capacitor 112 based on the value of the current output bit. Each output bit is used to control the application of either $+V_{REF}$ or $-V_{REF}$ to capacitor 112. For example, when the current output bit is a "0," switch 106 is closed and $+V_{REF}$ is applied to the input capacitor 112, and when the current output bit is a "1," switch 108 is closed and $-V_{REF}$ is applied to input capacitor 112. In embodiments represented by FIG. 1, switches 106 and 108 represent an input switch network that is responsive to the digital output word.

During phase two, switch 116 is also closed, forming an integrating amplifier with input capacitor 112 having a capacitance C, opamp 120, and feedback capacitor 124 having a capacitance of C. The change in voltage on node 170 is integrated, and the output voltage is changed by the change in the voltage on node 170. This process is successively repeated until all output bits have been processed.

Comparator 190 generates an output bit by comparing a residue voltage $V_{RES}$ on node 180 to a reference potential. The residue voltage on node 180 is generated as follows:

$$V_{RES}(n) = V_{RES}(n-1) + V_{RES}(n-1) - b(n)V_{REF}, \quad (1)$$

where $b(n) = \text{sign}[V_{RES}(n)]$.

In equation (1) above, the first term is realized with the integrator formed by opamp 120 and capacitors 112 and 124, the second term is realized by sampling the output of opamp 120 on P1, and the third term is realized by applying either $+V_{REF}$ or $-V_{REF}$ to the sampling capacitor on the settling phase of P2 depending on the result of the comparison in the previous cycle.

Figure 2:
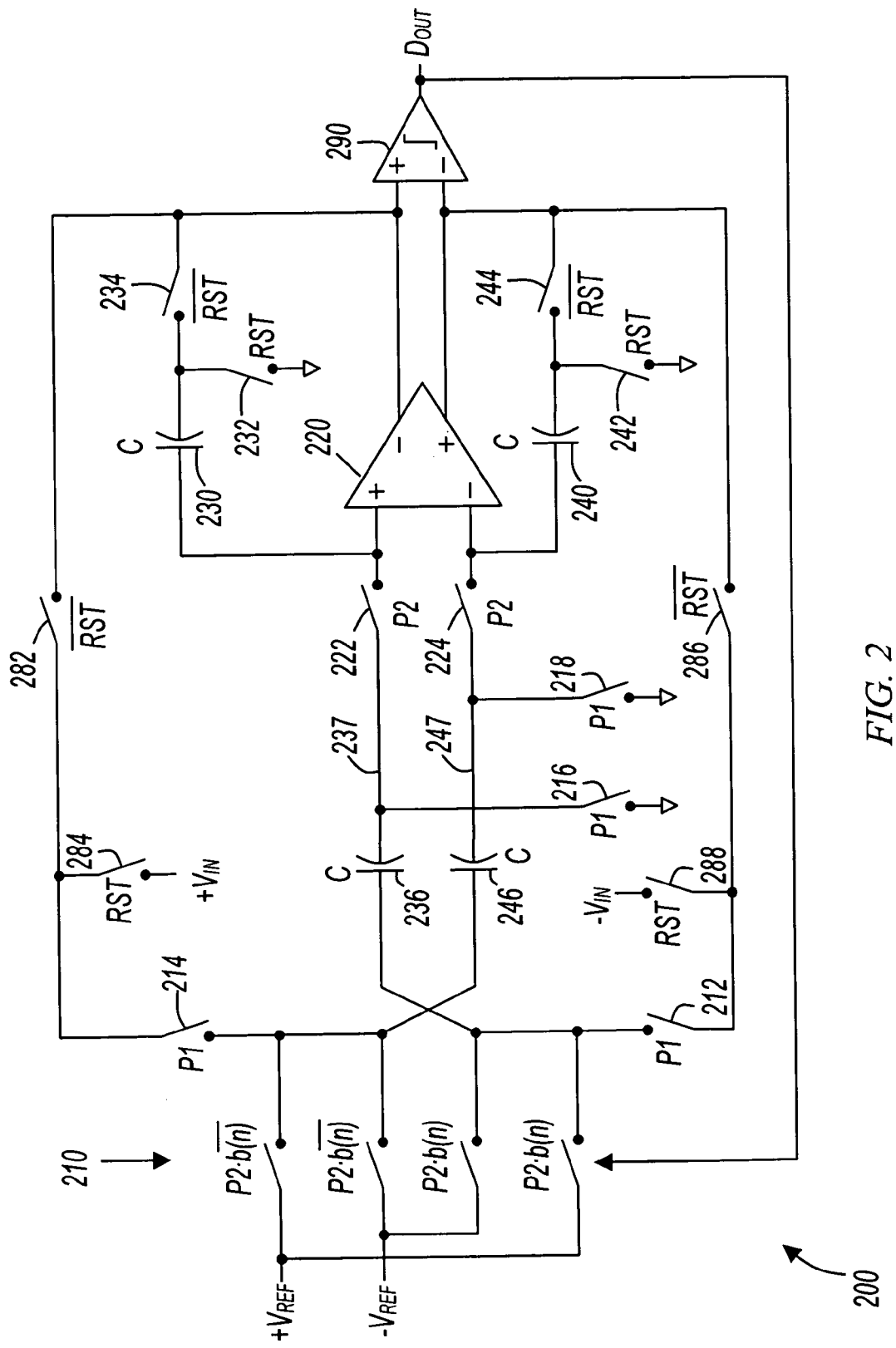
FIG. 2 shows a differential analog to digital converter circuit.

FIG. 2 shows a differential analog to digital converter. ADC 200 includes differential opamp 220, capacitors 230, 236, 240, and 246, and switches 210, 212, 214, 216, 218, 222, 224, 232, 234, 242, 244, 282, 284, 286, and 288. Switches 232, 234, 242, 244, 282, 284, 286, and 288 are reset switches as described above with reference to FIG. 1. Switches 212, 214, 216, and 218 are P1 switches, and switches 222 and 224 are P2 switches.

The operation of ADC 200 is similar to the operation of ADC 100 (FIG. 1). For example, during reset, switches 234, 244, 282, and 286 are open, switches 232, 242, 284, and 288 are closed, P1 switches are closed, and P2 switches are closed. Also during reset, $+V_{IN}$ is sampled on capacitor 236 and $-V_{IN}$ is sampled on capacitor 246. After a reset, RST is de-asserted for the remainder of the conversion of the input voltage $V_{IN}$ to a digital output word $D_{OUT}$. When RST is de-asserted, switches 234 and 244 close and switches 232 and 242 open to form feedback circuits that include capacitors 230 and 240. Further, with RST de-asserted, switches 284 and 288 open and switches 282 and 286 close to remove the input voltage $V_{IN}$ from the input. After ADC 200 is reset, P1 and P2 alternate for each bit in the digital output word.

During P1, the output of opamp 220 is fed back with a unity gain by feeding each output of opamp 220 to an input capacitor. For example, the positive output of opamp 220 is fed back to capacitor 236, and the negative output of opamp 220 is fed back to capacitor 246. Also during P1, switches 216 and 218 close to remove any charge from nodes 237 and 247.

During P2, switches 222 and 224 are closed to couple capacitors 236 and 246 to the input nodes of opamp 220. In this configuration, opamp 220 and capacitors 236, 246, 230, and 240 form a differential integrator, and the output voltage settles to equal the change in voltage on nodes 237 and 247 when switches 222 and 224 close.

Switches 210 combine the functionality of switches 106, 108, and 110 (FIG. 1). For example, two of the four switches 210 close during P2 based on the value of the current output bit. Two switches are closed when b(n) is true, and two switches are closed when b(n) is false, where b( ) is the output bit value and n is the subscript of the current output bit. As shown in FIG. 2, $+V_{REF}$ is applied to capacitors 236 and 246 when the current output bit is a "0," and $-V_{REF}$ is applied to capacitors 236 and 246 when the current output bit is a "1."

In some embodiments, switches 210 represent an input switch network that is responsive to a digital output word. In other embodiments, switches 210 represent two input switch networks. For example, two switches form a first input switch network to provide a reference voltage to capacitor 236, and two switches form a second input switch network to provide a reference voltage to capacitor 246.

Additional output bits are generated by continuing to alternately assert P1 and P2. Each time P1 is asserted, the output of opamp 220 is fed back to capacitors 236 and 246, and each time P2 is asserted, an output bit is generated and either $+V_{REF}$ or $-V_{REF}$ is applied to capacitors 236 and 246.

Figure 3:
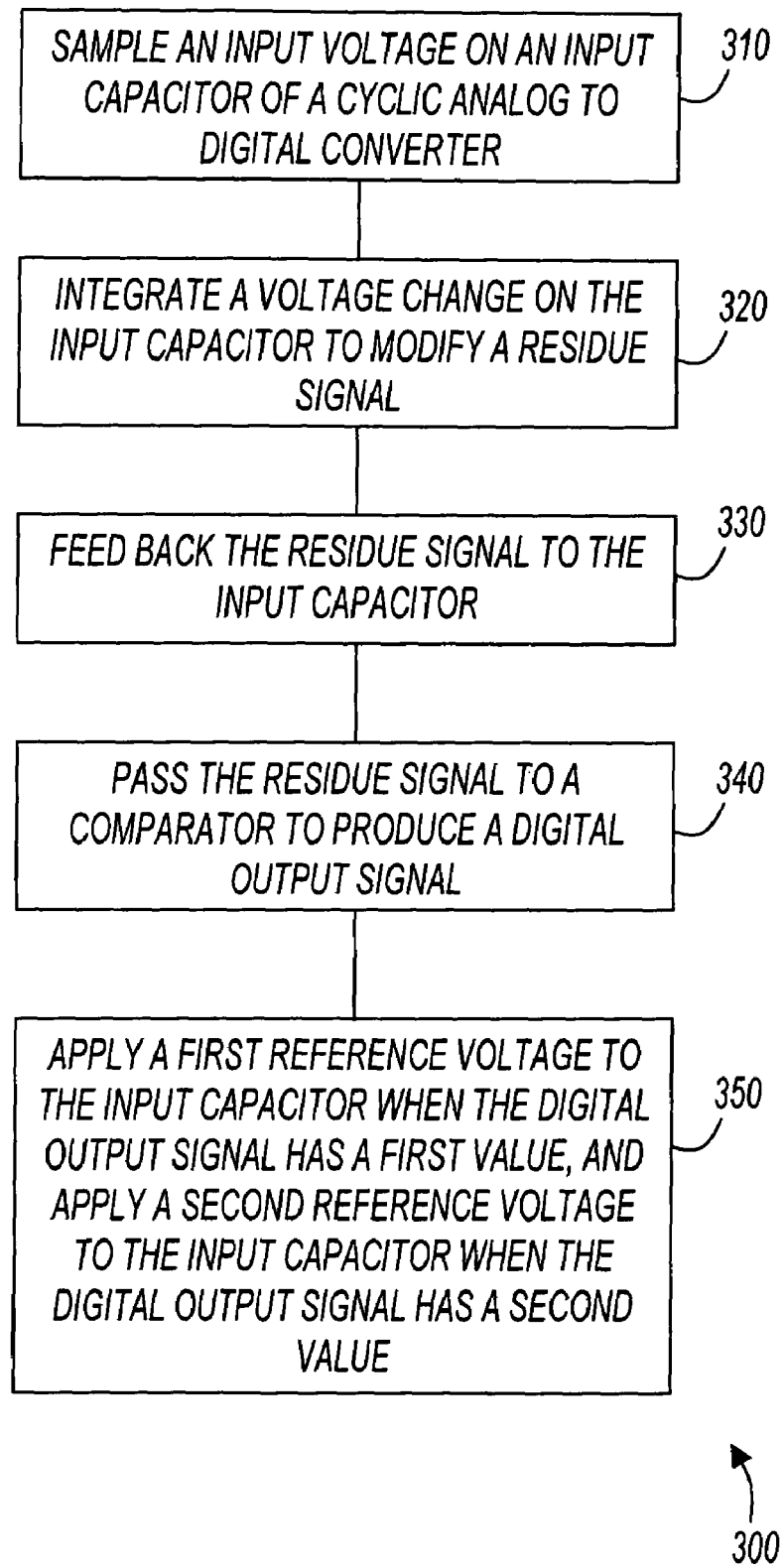
FIG. 3 shows a flowchart in accordance with various embodiments of the present invention.

FIG. 3 shows a flowchart in accordance with various embodiments of the present invention. In some embodiments, method 300 is performed by a single-ended cyclic ADC circuit such as ADC 100 (FIG. 1). In other embodiments, method 300 is performed by a differential ADC circuit such as ADC 200 (FIG. 2). In some embodiments, method 300, or portions thereof, is performed by an integrated circuit, embodiments of which are shown in the various figures. Method 300 is not limited by the particular type of apparatus or software element performing the method. The various actions in method 300 may be performed in the order presented, or may be performed in a different order. Further, in some embodiments, some actions listed in FIG. 3 are omitted from method 300.

Method 300 begins at 310 where an input voltage is sampled on an input capacitor of a cyclic analog to digital converter. In some embodiments, this may correspond to $V_{IN}$ being sampled on capacitor 112 (FIG. 1) during a reset of ADC 100. In other embodiments, this may correspond to $+V_{IN}$ being sampled on capacitor 246 and $-V_{IN}$ being sampled on capacitor 236 (FIG. 2) during a reset of ADC 200.

At 320, a voltage change on the input capacitor is integrated to modify a residue signal. This may correspond to opamp 120 (FIG. 1) or opamp 220 (FIG. 2) integrating the voltage change on the input capacitors to modify the opamp output voltage during P2. At 330, the residue signal is fed back to the input capacitor during P1. At 340, the residue signal is passed to a comparator to produce a digital output signal. For example, comparator 190 (FIG. 1) produces a digital output bit, and comparator 290 (FIG. 1) produces a digital output bit.

At 350, a first reference voltage is applied to the input capacitor when the digital output signal has a first value, and a second reference voltage is applied to the input capacitor when the digital output signal has a second value. For example, the output of comparator 190 (FIG. 1) controls switches 106 and 108, and the output of comparator 290 (FIG. 2) controls switches 210.

In some embodiments, acts of blocks 320, 330, 340, and 350 are successively repeated for each additional output bit. For example, if an ADC circuit is to produce a nine bit output word, then the blocks may be repeated eight times. When a new input voltage is to be converted to a digital word, method 300 begins again at 310.

Figure 4:
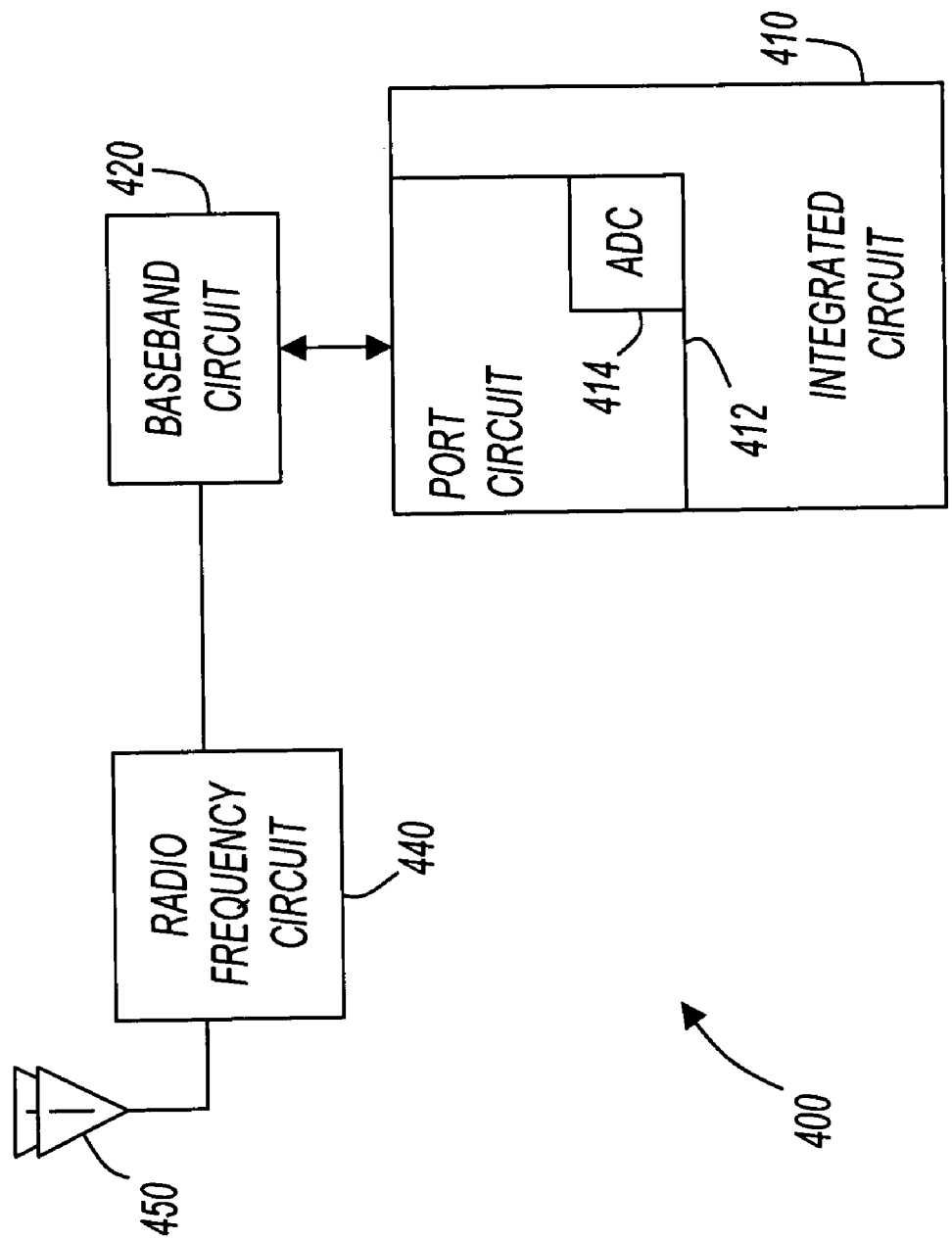
FIG. 4 shows a system diagram in accordance with various embodiments of the present invention.

FIG. 4 shows a system diagram in accordance with various embodiments of the present invention. FIG. 4 shows system 400 including integrated circuit 410, baseband circuit 420, radio frequency (RF) circuit 440, and antennas 450. In operation, system 400 processes a signal to be transmitted using baseband circuit 420, further processes it using RF circuit 440, and transmits it using antennas 450. System 400 may also receive signals using antennas 450 and RF circuit 440, and process the received signals using baseband circuit 420 and integrated circuit 410. Antennas 450 may include directional antennas or omni-directional antennas. As used herein, the term omni-directional antenna refers to any antenna having a substantially uniform pattern in at least one plane. For example, in some embodiments, one or more of antennas 450 may be an omni-directional antenna such as a dipole antenna, or a quarter wave antenna. Also for example, in some embodiments, one or more of antennas 450 may be a directional antenna such as a parabolic dish antenna or a Yagi antenna.

Integrated circuit 410 includes port circuit 412 and ADC circuit 414. Analog to digital converter (ADC) circuit 414 may be any of the ADC circuit embodiments described herein. For example, in some embodiments, ADC circuit 414 includes one or more of ADC circuit 100 (FIG. 1), or one or more of ADC circuit 200 (FIG. 2).

Integrated circuit 410 may be any type of integrated circuit capable of including one or more port circuits with an ADC circuit as shown. For example, integrated circuit 410 can be a processor such as a microprocessor, a digital signal processor, a microcontroller, or the like. Integrated circuit 410 can also be an integrated circuit other than a processor such as an application-specific integrated circuit (ASIC), a communications device, a memory controller, or a memory such as a dynamic random access memory (DRAM). For ease of illustration, portions of integrated circuit 410 are not shown. The integrated circuit may include much more circuitry than illustrated in FIG. 4 without departing from the scope of the present invention.

In some embodiments, ADC 414 is part of a built-in self test circuit within port circuit 412 that validates link performance by capturing transmission line waveforms, eye diagrams, and noise and jitter distributions. ADC 414 may provide calibration of several functional blocks within port circuit 412 to overcome the effects of non-linearity, offset and gain error. For example, port circuit 412 may include a comparator (not shown) with a digitally programmable offset voltage. In some embodiments, ADC 412 may be utilized during a built-in self test and calibration of the comparator.

Baseband circuit 420 may be any type of circuit to provide digital baseband processing in a communications system. In some embodiments, baseband circuit 420 includes a processor such as a digital signal processor (DSP), and in other embodiments, baseband circuit 420 is implemented as a system on a chip (SOC) that includes many functional blocks. In some embodiments, baseband circuit 420 provides digital data to RF circuit 440.

Radio frequency circuit 440 receives data from baseband circuit 420 and performs additional processing. For example, in some embodiments, RF circuit 440 performs modulation, filtering, frequency up-conversion, amplification, or the like. Further, in some embodiments, RF circuit also includes a receiver, and performs low noise amplification (LNA), frequency down-conversion, demodulation, or other functions.

Systems represented by the various foregoing figures can be any type of system that includes one more antennas. Examples of represented systems include computers with wireless functionality (e.g., desktops, laptops, handhelds, servers, tablets, web appliances, routers, etc.), wireless communications devices (e.g., cellular phones, cordless phones, pagers, personal digital assistants, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like. Many other system uses for ADC circuits exist. For example, ADC circuits may be used in systems without one or more antennas.

Analog to digital converter circuits, port circuits, integrated circuits, and other embodiments of the present invention can be implemented in many ways. In some embodiments, they are implemented in integrated circuits and systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An analog to digital converter comprising:
an amplifier;
a first capacitor coupled to an input node of the amplifier;
a second capacitor coupled between the input node of the amplifier and an output node of the amplifier, wherein the second capacitor has a capacitance value substantially equal to the first capacitor;
a feedback path to conditionally couple the output node of the amplifier to the first capacitor;
a comparator coupled to the output node of the amplifier to provide a digital output value; and
at least one switching element responsive to the digital output value, the at least one switching element coupled to the first capacitor to apply a reference voltage to the first capacitor.

2. The analog to digital converter of claim 1 wherein the amplifier comprises an operational amplifier.

3. The analog to digital converter of claim 1 further comprising a switch to isolate the first capacitor from the input node of the amplifier when the output node of the amplifier is coupled to the first capacitor.

4. The analog to digital converter of claim 1 wherein the conditional feedback path has a gain of substantially 1.

5. The analog to digital converter of claim 1 wherein the at least one switching element includes a first switching element coupled to conditionally apply a positive reference voltage to the first capacitor, and a second switching element coupled to conditionally apply a negative reference voltage to the first capacitor.

6. The analog to digital converter of claim 1 wherein the at least one switching element includes a first switch coupled to a first reference voltage node, and a second switch coupled to a second reference voltage node.

7. The analog to digital converter of claim 1 further comprising an additional capacitor and an input switch network coupled to a second input node of the amplifier to provide a differential input.

8. An analog to digital converter having an input capacitor and input switch network that samples a residue voltage on a first phase of a clock and samples a reference voltage on a second phase of the clock, an amplifier and feedback capacitor that integrate a difference between the residue voltage and the reference voltage, and a comparator to provide a digital output signal from the residue voltage, wherein the input switch network includes at least one switch responsive to the digital output signal, and wherein the at least one switch includes a first switch coupled to a first reference voltage node, and a second switch coupled to a second reference voltage node.

9. The analog to digital converter of claim 8 wherein the amplifier comprises an operational amplifier.

10. A method comprising:
sampling an input voltage on an input capacitor of a cyclic analog to digital converter;
integrating a voltage change on the input capacitor to modify a residue signal by a voltage having a magnitude substantially equal to the voltage change;
feeding back the residue signal to the input capacitor;

passing the residue signal to a comparator to produce a digital output signal; and applying a first reference voltage to the input capacitor when the digital output signal has a first value, and applying a second reference voltage to the input capacitor when the digital output signal has a second value.

11. The method of claim 10 further comprising successive repetition for remaining bits of the digital output signal.

12. The method of claim 10 wherein integrating the voltage change comprises integrating the voltage change with an operational amplifier having capacitive feedback.

13. An electronic system comprising:

an antenna; and an integrated circuit to operate on signals received by the antenna, the integrated circuit including a port circuit having an analog to digital converter that includes an input capacitor and input switch network that samples a residue voltage on a first phase of a clock and samples a reference voltage on a second phase of the clock, an amplifier and feedback capacitor that integrate a difference between the residue voltage and the reference voltage, and a comparator to provide a digital output signal from the residue voltage, wherein the input switch network includes at least one switch responsive to the digital output signal.

14. The electronic system of claim 13 wherein the amplifier comprises an operational amplifier.

* * * * *

UNITED STATES PATENT AND TRADEMARK OFFICE
CERTIFICATE OF CORRECTION

| | | |
|---|---|---|
| PATENT NO. | : 7,102,560 B2 | Page 1 of 1 |
| APPLICATION NO. | : 11/027477 | |
| DATED | : September 5, 2006 | |
| INVENTOR(S) | : Casper et al. | |

It is certified that error appears in the above-identified patent and that said Letters Patent is hereby corrected as shown below:

In column 8, line 10, in Claim 13, after "signal" delete "." and insert -- , and wherein the at least one switch includes a first switch coupled to a first reference voltage node, and a second switch coupled to a second reference voltage node. --, therefor.

Signed and Sealed this

Nineteenth Day of December, 2006

JON W. DUDAS
*Director of the United States Patent and Trademark Office*